(12) United States Patent
Yao et al.

(10) Patent No.: US 11,854,794 B2
(45) Date of Patent: Dec. 26, 2023

(54) SEMICONDUCTOR CLEANING EQUIPMENT AND METHOD FOR CLEANING THROUGH VIAS USING THE SAME

(71) Applicant: NATIONAL CENTER FOR ADVANCED PACKAGING CO., LTD., Jiangsu (CN)

(72) Inventors: Daping Yao, Jiangsu (CN); Liqiang Cao, Jiangsu (CN)

(73) Assignee: NATIONAL CENTER FOR ADVANCED PACKAGING CO., LTD., Jiangsu (CN)

( * ) Notice: Subject to any disclaimer, the term of this patent is extended or adjusted under 35 U.S.C. 154(b) by 532 days.

(21) Appl. No.: 17/258,449

(22) PCT Filed: Dec. 18, 2018

(86) PCT No.: PCT/CN2018/121712
§ 371 (c)(1),
(2) Date: Jan. 7, 2021

(87) PCT Pub. No.: WO2020/019639
PCT Pub. Date: Jan. 30, 2020

(65) Prior Publication Data
US 2021/0296115 A1   Sep. 23, 2021

(30) Foreign Application Priority Data
Jul. 23, 2018 (CN) .......................... 201810811141.X

(51) Int. Cl.
*H01L 21/02* (2006.01)
*B05B 7/16* (2006.01)
(Continued)

(52) U.S. Cl.
CPC ...... *H01L 21/02063* (2013.01); *B05B 7/1613* (2013.01); *B08B 3/08* (2013.01);
(Continued)

(58) Field of Classification Search
CPC ......... H01L 21/02063; H01L 21/67051; B05B 1/14; B05B 1/34
See application file for complete search history.

(56) References Cited

U.S. PATENT DOCUMENTS

| | | | |
|---|---|---|---|
| 2004/0124230 A1* | 7/2004 | Hertz | B08B 7/028 228/208 |
| 2016/0201984 A1* | 7/2016 | Ma | B08B 3/10 34/275 |
| 2019/0287815 A1* | 9/2019 | Xu | H01F 41/24 |

FOREIGN PATENT DOCUMENTS

| | | |
|---|---|---|
| CN | 1213457 | 4/1999 |
| CN | 1773674 | 5/2006 |

(Continued)

OTHER PUBLICATIONS

"International Search Report (Form PCT/ISA/210) of PCT/CN2018/121712," dated Apr. 22, 2019, with English translation thereof, pp. 1-5.

*Primary Examiner* — Jae Lee
(74) *Attorney, Agent, or Firm* — JCIP GLOBAL INC.

(57) ABSTRACT

A method for cleaning a through via including the following steps is provided: heating a cleaning fluid to a predetermined temperature; mixing the cleaning liquid with an inert gas and entering into a cleaning cavity; atomizing the cleaning liquid in an atomizer to spray on a wafer surface and to wet an inner wall and a bottom of the through via; and closing a cleaning liquid valve.

12 Claims, 7 Drawing Sheets

(51) Int. Cl.
*B08B 3/08* (2006.01)
*B08B 3/10* (2006.01)
*H01L 21/768* (2006.01)

(52) U.S. Cl.
CPC ............ *B08B 3/10* (2013.01); *H01L 21/0229* (2013.01); *H01L 21/02164* (2013.01); *H01L 21/76898* (2013.01); *B08B 2203/007* (2013.01)

(56) References Cited

FOREIGN PATENT DOCUMENTS

| | | |
|---|---|---|
| CN | 101096753 | 1/2008 |
| CN | 101523592 | 9/2009 |
| CN | 101592875 | 12/2009 |
| CN | 102441843 | 5/2012 |
| CN | 102844845 | 12/2012 |
| CN | 105344511 | 2/2016 |
| JP | 2015099851 | 5/2015 |

* cited by examiner

SEMICONDUCTOR CLEANING EQUIPMENT AND METHOD FOR CLEANING THROUGH VIAS USING THE SAME

CROSS-REFERENCE TO RELATED APPLICATION

This application is a 371 application of the International PCT application serial no. PCT/CN2018/121712, filed on Dec. 18, 2018, which claims the priority benefit of China application no. 201810811141.X, filed on Jul. 23, 2018. The entirety of each of the above mentioned patent applications is hereby incorporated by reference herein and made a part of this specification.

BACKGROUND

Technical Field

The present application relates to the field of semiconductor manufacturing equipment, in particular to semiconductor cleaning equipment and method for cleaning through vias using the same.

Description of Related Art

With the development of TSV (Through Silicon Via) technology, more and more products may use high-density, high-aspect-ratio TSV vias. For example, the packaging structure based on TSV via interposer enables multiple chips to be directly interconnected on the interposer, which greatly reduces the wiring length. In addition, the silicon-based interposer can form interconnecting wires with smaller line width, so the wiring density is greatly improved.

The TSV vias are generally manufactured by etching the TSV blind holes, and then back thinning the wafer to expose holes on the back. The residues from etching and/or photoresist are usually remained in the etched TSV blind holes. The presence of these residues may result in defects such as incomplete filling of TSV vias or pores therein. Therefore, TSV vias need to be cleaned to remove the residues. Existing wafer cleaning technologies include: slot ultrasonic cleaning, monolithic megasonic cleaning, monolithic high-pressure water jet cleaning, etc. When the hole diameter of the TSV blind hole is small and the aspect ratio is large, the liquid in the through via is difficult to infiltrate due to the surface tension of the cleaning liquid, which results in difficulty in liquid exchange in the TSV blind hole. Conventional cleaning methods are difficult to clean up the etching residue and photoresist residue in the TSV blind via.

Therefore, there is a need for a semiconductor cleaning equipment and method for cleaning through vias using the same.

SUMMARY

In view of the problems existing in prior arts, according to one aspect of the present invention, it provides a method for cleaning a through via, comprising: heating a cleaning liquid to a predetermined temperature; mixing the cleaning liquid with an inert gas and entering into a cleaning chamber; atomizing the cleaning liquid in an atomizer, to spray on a wafer surface and to wet an inner wall and a bottom of the through via; and closing a cleaning liquid valve.

In an embodiment of the present invention, a flow velocity of a two-fluid composed of the cleaning liquid and the inert gas is changed by adjusting a flow rate of the inert gas, and an atomization degree and a droplet size of the two-fluid in the atomizer are changed at the same time.

In an embodiment of the present invention, the cleaning fluid is added in a pulse mode by opening and closing the valves of the gas and liquid pipelines.

In an embodiment of the present invention, the cleaning liquid and the inert gas enter into the cleaning chamber through a straight through hole and an oblique through hole of the atomizer, and the cleaning liquid turns into an atomized state after multiple impacts with an inner wall of the cleaning chamber.

In an embodiment of the present invention, the method further comprises: introducing the inert gas into the cleaning chamber through a horizontal hole in a middle of a reverse funnel-shaped top cover.

In an embodiment of the present invention, after closing the cleaning liquid valve, further comprises: opening a preheated pure water valve; keeping flow rate of the inert gas unchanged or slightly increasing the flow rate of the inert gas; atomizing a gas-water two-fluid, and using an atomized water to rinse an inside of the through via and the wafer surface.

In an embodiment of the present invention, after cleaning, further comprises: heating a passivation solution to a predetermined temperature; mixing the passivation solution with an inert gas into the cleaning chamber; turning the passivation solution in the atomizer into an atomized state, to spray on the wafer surface and to wet the inner wall and the bottom of the through via, and to forma silicon oxide layer having a thickness on the inner wall of through silicon via; closing the passivation solution valve.

In an embodiment of the present invention, after closing the passivation solution valve, further comprises: opening a pure water valve and re-cleaning the wafer surface and the inner wall of the through via to remove the remaining passivation liquid; closing the pure water valve and keeping the inert gas flow to dry the wafer surface.

According to another embodiment of the present invention, it provides a method for cleaning and passivating a through via, comprising: heating a cleaning liquid and a passivation solution to a predetermined temperature; mixing the cleaning liquid and the passivation solution with an inert gas and entering into a cleaning chamber; atomizing the cleaning liquid and the passivation solution in an atomizer, to spray on the wafer surface and to wet an inner wall and a bottom of the through via; closing a cleaning liquid valve and a passivation solution valve.

In another embodiment of the present invention, a flow velocity of a two-fluid composed of the liquid and the gas is changed by adjusting a flow rate of the inert gas, and an atomization degree and a droplet size of the two-fluid in the atomizer are changed at the same time.

In another embodiment of the present invention, the cleaning fluid and the passivation solution are added in a pulse mode by opening and closing the valves of the gas and liquid pipelines.

In another embodiment of the present invention, the method further comprises: introducing the inert gas into the cleaning chamber through a horizontal hole in a middle of a reverse funnel-shaped top cover.

In another embodiment of the present invention, after closing the cleaning liquid valve and the passivation solution valve, further comprises: opening a pure water valve and re-cleaning the wafer surface and the inner wall of the through via to remove the remaining cleaning liquid and passivation liquid; closing the pure water valve and keeping the inert gas flow to dry the wafer surface.

BRIEF DESCRIPTION OF THE DRAWINGS

In order to further clarify the above and other advantages and features of the embodiments of the present invention, a more specific description of various embodiments of the present invention will be presented with reference to the accompanying drawings. It can be understood that these drawings only depict typical embodiments of the present invention and therefore should not be considered as a limitation of its scope. In the drawings, the same or corresponding parts will be indicated by the same or similar marks for the sake of clarity.

DESCRIPTION OF THE EMBODIMENTS

Figure 1:
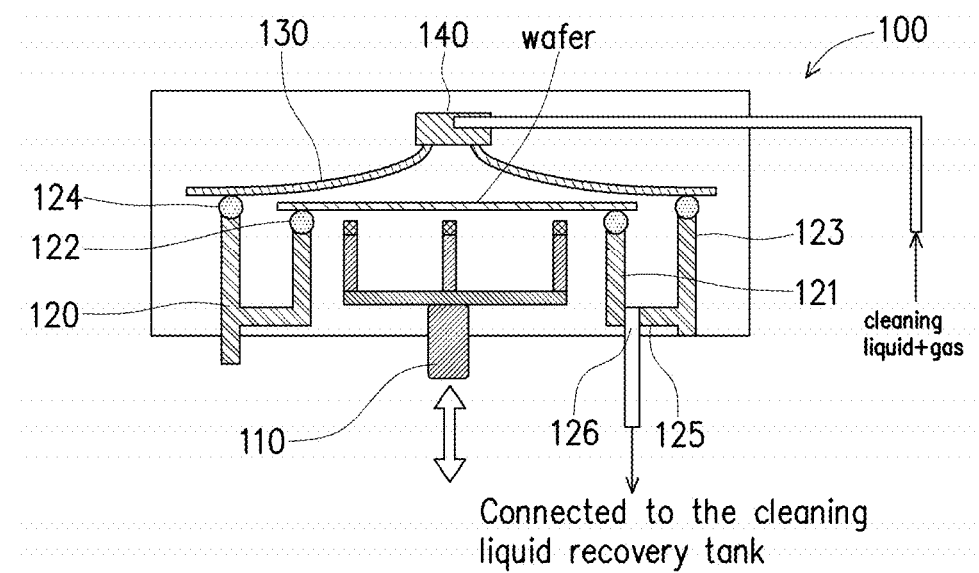
FIG. 1 shows vertical sectional schematic diagram of semiconductor cleaning equipment 100 according to an embodiment of the present invention.

In the following description, the present invention will be described with reference to various embodiments. However, those skilled in the art will recognize that the various embodiments can be implemented without one or more specific details or with other alternative and/or additional methods, materials or components. In other cases, well-known structures, materials or operations are not shown or described in detail so as not to obscure aspects of the various embodiments of the present invention. Similarly, for purposes of explanation, specific quantities, materials, and configurations are set forth in order to provide a thorough understanding of the embodiments of the present invention. However, the present invention can be implemented without specific details. In addition, it should be understood that the various embodiments shown in the drawings are illustrative representations and are not necessarily drawn to scale.

In the present description, reference to "one embodiment" or "the embodiment" means that a specific feature, structure, or characteristic described in connection with the embodiment is included in at least one embodiment of the present invention. The appearances of the phrase "in one embodiment" in various places in the present description do not necessarily all refer to the same embodiment.

FIG. 1 shows vertical sectional schematic diagram of semiconductor cleaning equipment 100 according to an embodiment of the present invention. As shown in FIG. 1, the semiconductor cleaning equipment 100 may include a bracket 110 and its movement control system, a liquid storage cup 120 and its movement control system, a top cover 130 and an atomizer 140.

The bracket 110 and its movement control system may be arranged on the base of the semiconductor cleaning equipment 100 for positioning and supporting the wafer before cleaning. The bracket 110 may be a three-arm bracket or other brackets, for example, a suction cup bracket, to achieve more stable wafer clamping through vacuum adsorption. When the wafer should be separated from the bracket, the vacuum adsorption can be unloaded.

Figure 2:
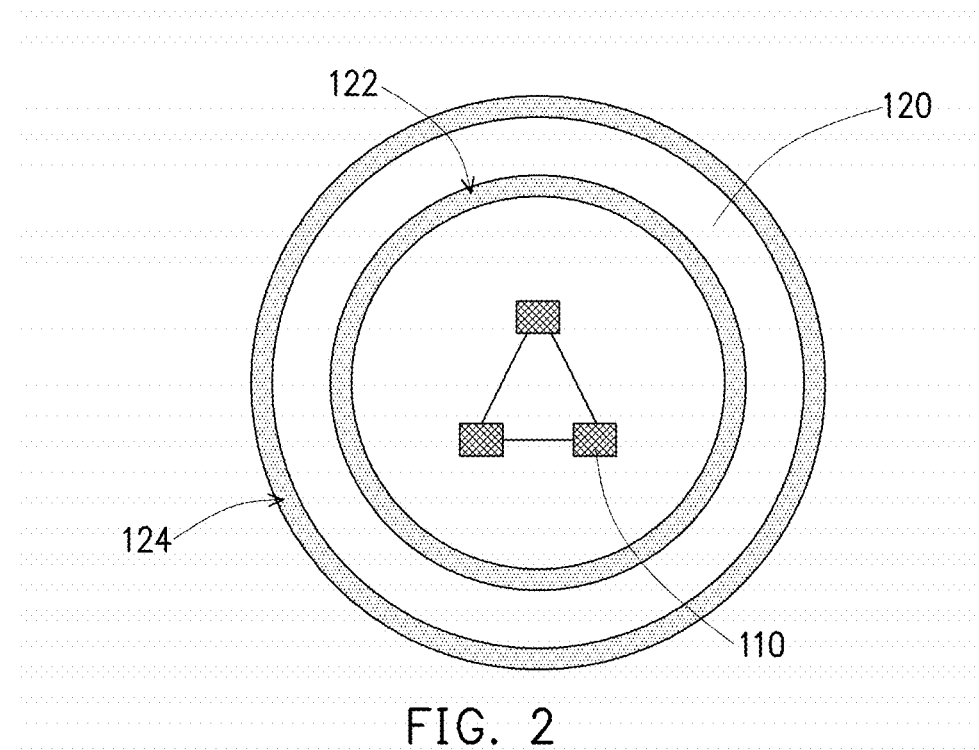
FIG. 2 shows a top view of the liquid storage cup 120 and the bracket 110.

The liquid storage cup 120 and its movement control system may be arranged on the base of the semiconductor cleaning equipment 100 for collecting waste cleaning liquid. In some embodiments of the present invention, the liquid storage cup 120 may also provide liquid immersion function. The liquid storage cup 120 may be a hollow annular cup body. The bracket 110 is located in the hollow part of the liquid storage cup. FIG. 2 shows a top view of the liquid storage cup 120 and the bracket 110. In combination with FIG. 1 and FIG. 2, the liquid storage cup 120 includes an inner wall 121, a gasket 122 provided at the top of the inner wall 121, an outer wall 123, a gasket 124 provided at the top of the outer wall 123, and a cup bottom 125 connecting the inner wall and the outer wall. The gaskets 122 and 124 may be O-rings having water, acid, or high temperature resistance. The top end of the outer wall 123 may be higher than the top end of the inner wall 121. A vacuum suction nozzle may also be provided on the top of the gasket 122 on the top of the inner wall 121 to achieve more stable wafer clamping through vacuum suction. When the wafer should be separated from the gasket 122, the vacuum suction can be unloaded.

The liquid storage cup 120 may further include a liquid outlet 126. The liquid outlet 126 may be provided at the bottom or side of the liquid storage cup 120 and connected with a pipe for draining or collecting the waste cleaning liquid.

The movement control system of the liquid storage cup 120 is used to vertically move the liquid storage cup 120 upwards before cleaning, so that the gasket 122 on the top of the inner wall 121 of the cup holds up the wafer, and the gasket 122 on the top of the outer wall 123 of the cup contacts the top cover 130 contacts. The top cover 130 and the liquid storage cup 120 constitute a sealed cleaning chamber. After the cleaning is completed, the liquid storage cup 120 is vertically moved downward, the liquid storage cup 120 is separated from the top cover 130, the wafer contacts the bracket 110, and then the gasket 122 on the top of the inner wall 121 of the cup is separated from the wafer.

Figure 3:
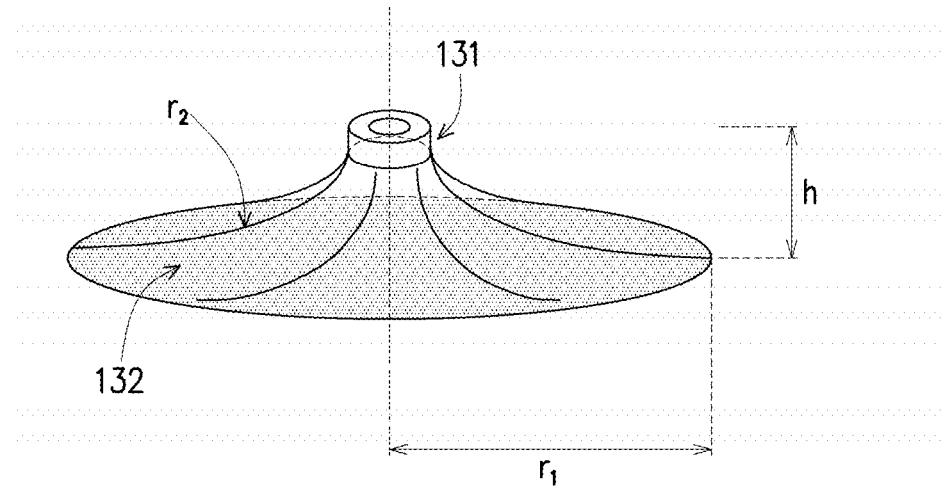
FIG. 3 shows a three-dimensional schematic diagram of the top cover 130.

FIG. 3 shows a three-dimensional schematic diagram of the top cover 130. The top cover 130 may have a reverse funnel shape, including a neck 131 and a bottom 132. The neck 131 is located at the upper part of the top cover 130 and is smaller than the bottom 132. As shown in FIG. 3, the shape and size of the top cover 130 are determined by three key dimensions: the bottom radius $r_1$, the outer radius $r_2$ of the funnel, and the height h of the top cover. The bottom radius $r_1$ refers to the radius of the circle of the opening part of the top cover contacting the liquid storage cup 120, the outer radius $r_2$ of the funnel refers to the radius of the upper outer curved surface of the top cover, that is, the radius of the inflection point portion where the curved surface is transformed to an approximate plane, and the height h of the top cover refers to the vertical distance from the neck 131 to the bottom 132. The entire top cover may be smooth from the top to the bottom. For example, the top cover 130 may have a hyperbolical surface, or a curved surface in the up half portion and a flat surface in bottom half. Generally, the bottom radius $r_1$ of the top cover 130 is larger than the radius of the wafer to be processed. According to actual requirements, the top cover with different sizes of bottom radius $r_1$, the outer radius $r_2$ of the funnel and height h may be manufactured to achieve a more suitable atomization effect.

The materials that may be used to make the top cover 130 include: aluminum alloy, aluminum alloy with protective coating on the surface, other metal alloys resistant to heat and corrosion, highly clean PVC, Teflon (for acid and alkali cleaning) or similar polymer materials resistant to heat and corrosion.

Figure 4A:
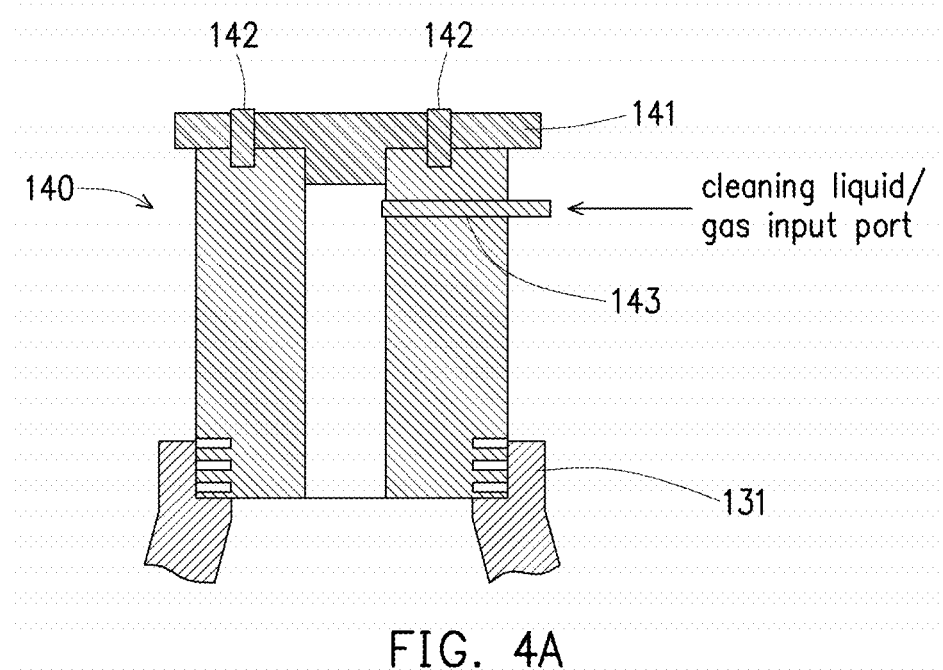
FIG. 4A shows a sectional front view of an atomizer according to an embodiment of the present invention.
Figure 4B:
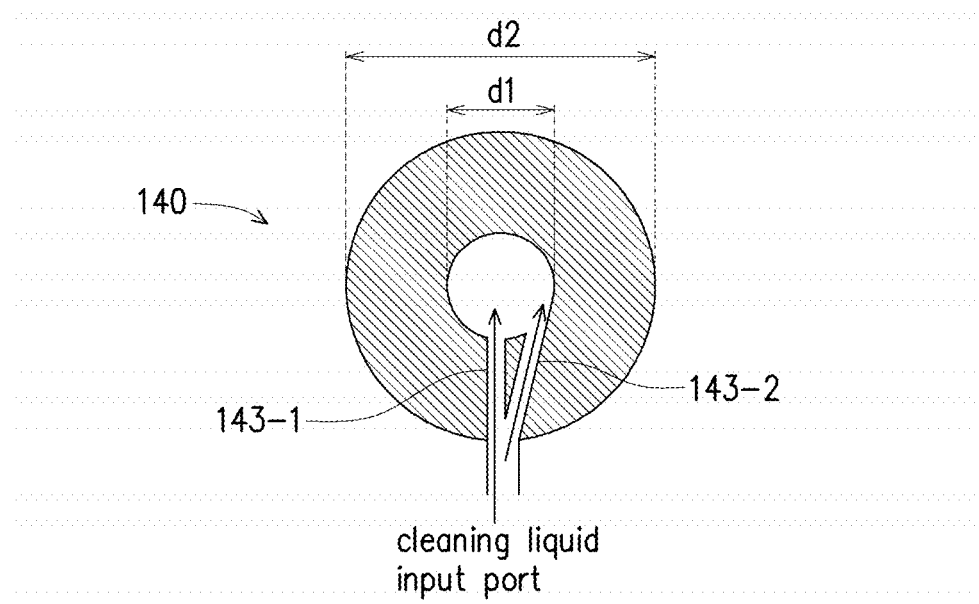
FIG. 4B shows a cross-sectional top view of an atomizer according to an embodiment of the present invention.

FIG. 4A shows a sectional front view of an atomizer according to an embodiment of the present invention. FIG. 4B shows a cross-sectional top view of an atomizer according to an embodiment of the present invention. Referring to FIG. 4A and FIG. 4B, the atomizer 140 is mounted on the neck 131 of the top cover. For example, the atomizer 140 may be fixed to the neck 131 of the top cover 130 by screwing. The atomizer 140 is in the shape of a cylinder, with an inner wall diameter d1 and an outer wall diameter $d_2$. The outer/inner diameter ratio $(d_2/d_1)$ can be controlled between 2:1 and 20:1 to achieve different atomization effects. The upper end of the atomizer is sealed by a cover plate 141. For example, the cover plate 141 can be fixed to the upper end of the atomizer by one or more screws 142. There may be one or more through holes 143 at a certain distance from the upper end. The through holes 143 may comprise one straight through hole 143-1 and one oblique through hole 143-2. The straight through hole 143-1 and the oblique through hole 143-2 are through holes extending horizontally. In the cross section shown in FIG. 4B, the straight through hole 143-1 may form a 90-degree angle with the tangent line at the intersection of the straight through hole 143-1 and the inner wall of the cylinder; and the oblique through hole 143-2 may form a specific angle, but not a right angle, with the tangent line at the intersection of the oblique through hole 143-2 and the inner wall of the cylinder. After the fluid is connected to the through hole 143, there are two channels inside the through hole 143, reaching the center of the cylinder through the straight through hole 143-1; entering into atomizer 140 through the oblique through hole 143-2 at an angle of 30-60 degree to the straight through hole 143-1.

In other embodiments of the present invention, the atomizer 140 may comprise a plurality of straight through holes and a plurality of oblique through holes. The angles formed by oblique through holes and their corresponding tangent lines at the intersection of the oblique through holes and the inner wall of the cylinder may be the same or different.

The cleaning fluid enters the cleaning chamber through the straight through holes and the oblique through holes. This device is designed to allow the cleaning liquid to be atomized and sprayed onto the wafer surface quickly and evenly in the shortest time after passing through the reverse funnel device.

In other embodiments of the present invention, the top cover 130 and the atomizer 140 may be integrally formed, rather than being connected by screw-thread. In other words, the atomizer 140 may be a part of the neck of the top cover 130.

In an embodiment of the present invention, a three-way valve (not shown in the figure) may also be provided on the cleaning fluid pipe connected to the cleaning chamber. The three-way valve may include a cleaning fluid input port, a gas input port, and a gas-liquid two-fluid output port. The cleaning liquid and the compressed gas enter the three-way valve through the cleaning liquid input port and the gas input port respectively, and are mixed to form a gas-liquid two-fluid, and then enter the cleaning liquid pipeline. The mixing ratio of gas-liquid two-fluid can be adjusted by adjusting the flow velocity of the cleaning liquid or the flow velocity of the compressed gas.

The cleaning liquid with the gas enters the inside of the funnel from the top of the funnel at a high speed. After the gas-liquid two-fluid impacts on the inner surface of the funnel for the first time, most of the liquid is atomized, and the remaining liquid droplets impact on the inner surface of the funnel quickly for the second time, and turn into fog state in part.

Figure 5:
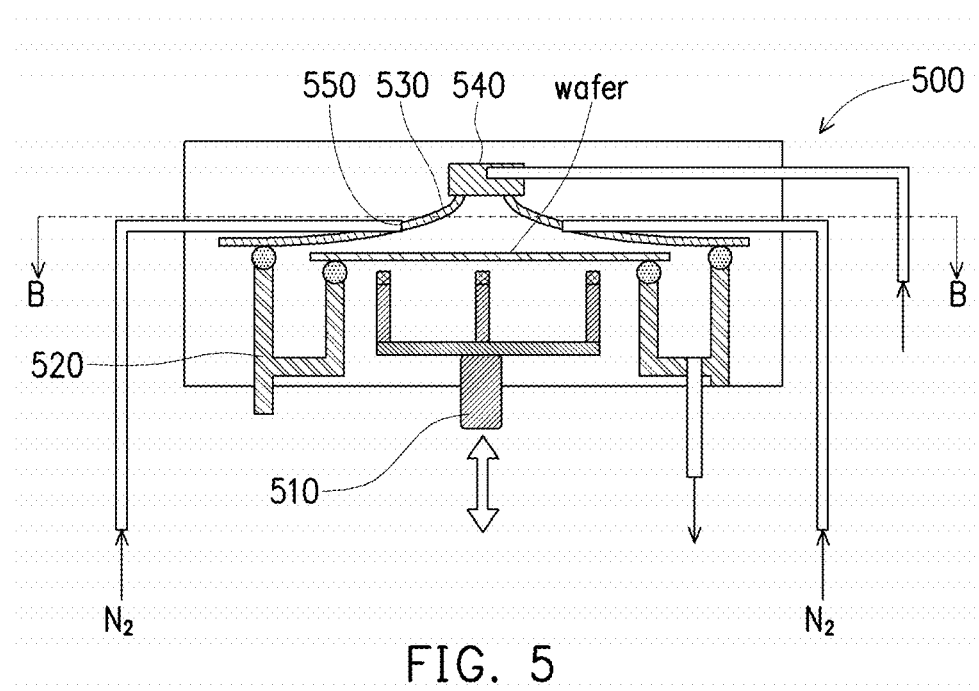
FIG. 5 shows vertical sectional schematic diagram of semiconductor cleaning equipment 500 according to another embodiment of the present invention.

FIG. 5 shows vertical sectional schematic diagram of semiconductor cleaning equipment 500 according to another embodiment of the present invention. As shown in FIG. 5, the semiconductor cleaning equipment 500 may include a bracket 510 and its movement control system, a liquid storage cup 520 and its movement control system, a top cover 530, an atomizer 540 and atomization enhancement device 550.

Figure 6:
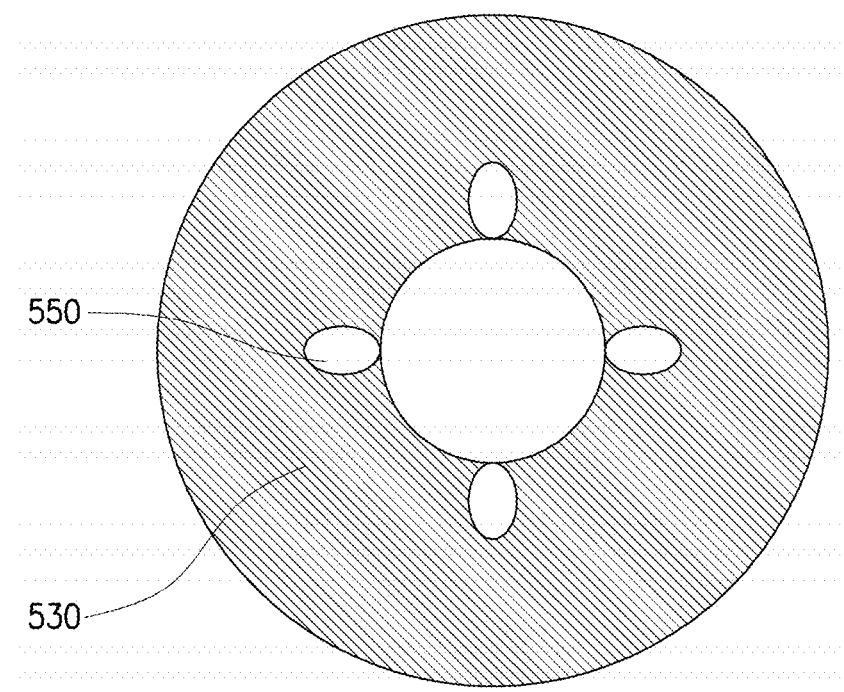
FIG. 6 shows a schematic cross-sectional top view taken along B-B in the middle of the top cover 530.

In an embodiment of the present invention, a plurality of horizontal through holes may be respectively provided in the middle of the top cover 530, that is, approximately in the middle of the central axis and the edge. The inert gas, such as nitrogen, is connected to the other end of the horizontal through holes. FIG. 6 shows a cross-sectional top view taken along B-B in the middle of the top cover 530. As shown in FIG. 6, the cross section of the top cover is circular, and four horizontal through holes are evenly distributed in the middle of the top cover 130 as the atomization enhancement device 550. The four horizontal through holes are horizontally extending through holes. In the cross section shown in FIG. 6, the four horizontal through holes may form specific angles with the tangent lines at the intersection points of the circular inner wall. For example, the four horizontal through holes may form 45 degree angles with the tangent lines at the intersection points of the circular inner wall. At this portion, the incoming airflow atomizes the top fog flow for the second time to achieve an enhanced atomization effect. In addition, the size of the droplets in the fog may become smaller, and under some process conditions, the characteristics similar to the gas state may be achieved. At the same time, the inert gas flowing tangentially makes the cleaning fog on the wafer surface flow in a circle.

In other embodiments of the present invention, more or fewer horizontal through holes may be provided in the middle of the top cover 530. For example, 2 horizontal through holes, 3 horizontal through holes, or 5 or more horizontal through holes may be provided in the middle of the top cover 530.

In the embodiment of the present invention, the semiconductor cleaning equipment may further include a heating tank (not shown in the figure). The heating tank is connected with the neck through hole of the top cover through a pipe. The cleaning liquid is heated by the heating tank. For example, the heating tank is filled with cleaning liquid, and the outer wall of the tank is heated to a set temperature by resistance wires or other heating manners. The semiconductor cleaning equipment may include a plurality of heating tanks, each of which may contain different cleaning liquids, so that the wafer may be processed multiple times with different process conditions or different liquids.

Since the O-rings are provided between liquid storage cup and the back of the wafer, the upper chamber cover, to prevent the liquid from overflowing or splashing out of the chamber, the liquid storage cup may also have liquid immersion function, which expands the application range of the equipment.

Figure 7:
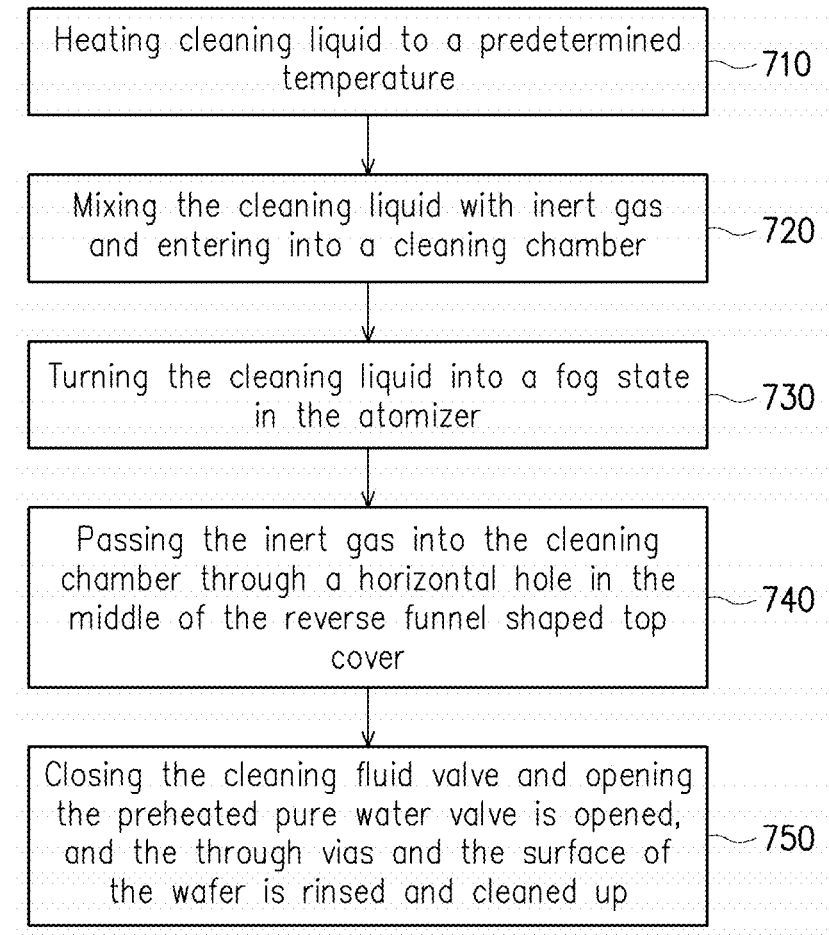
FIG. 7 shows a process flow diagram of cleaning through vias using a semiconductor cleaning device according to an embodiment of the present invention.

FIG. 7 shows a process flow diagram of cleaning through vias using a semiconductor cleaning device according to an embodiment of the present invention.

At step 710, the cleaning liquid is heated to a predetermined temperature. Different types of cleaning fluids may be selected. For example, the cleaning liquid may be ammonia water. The concentration of ammonia may be selected as 30 wt %.

At step 720, the cleaning liquid may be mixed with inert gas and enter into a cleaning chamber. According to the preset gas-liquid ratio, the flow or pressure of the cleaning liquid and/or inert gas to be sent may be adjusted, and then the cleaning liquid and the inert gas are sent into the cleaning cavity together through the three-way valve. In the semiconductor cleaning equipment disclosed in the present invention, the flow velocity of the two-fluid may be changed by adjusting the flow rate of the inert gas (such as nitrogen), meanwhile the behavior of the two-fluid in the atomization device (i.e., atomizer), such as the degree of atomization (i.e. the ratio of the fog and the liquid) and droplet size, may be affected.

In an embodiment of the present invention, the cleaning fluid may be added in pulse mode by opening and closing the valves of the gas and liquid pipelines. This manner may be used to increase the cleaning efficiency of narrow gaps on the wafer surface.

At step 730, the cleaning liquid is turned into a fog state in the atomizer. The liquid-gas flow enters into the cleaning chamber through the straight through holes and the oblique through holes of the atomizer, and most of the cleaning liquid turns into a fog state after multiple impacts with the inner wall of the chamber. The cleaning liquid with the gas enters the inside of the funnel from the atomizer at a high speed. After the gas-liquid two-fluid impacts on the inner surface for the first time, most of the liquid is atomized, and the remaining liquid droplets impact on the inner surface quickly for the second time, and turn into fog state in part.

The heated fog cleaning liquid is then evenly sprayed on the surface of the wafer, fully wets the inner wall and bottom of the through via, and the cleaning effect is greatly improved.

When the droplets infiltrate the gaps on the wafer surface, the input port of the two-fluid is closed, so that the surface to be cleaned can be soaked, increasing the surface adsorption time and adsorption capacity of the cleaning agent.

At step 740, optionally, the inert gas may be introduced into the cleaning chamber through a horizontal hole in the middle of the reverse funnel-shaped top cover. The inert gas may be nitrogen. On the one hand, the incoming inert gas stream turns most of the incoming cleaning liquid into a fog state, and on the other hand, the laterally flowing inert gas makes the cleaning fog on the wafer surface flow in a circle. The gas flow is increased by introducing gas in the middle of the cavity, and the fog droplets are agitated and diluted again to make the size smaller and close to the gas state.

The fog cleaning agent is easier to enter the smaller gaps, and at the same time, is blown by the continuous inflow of gas to the wafer surface, and the adsorption layer on the surface becomes thin.

The fog droplets are blown by the airflow and rotate rapidly on the wafer surface, which greatly reduces the thickness of the surface adsorption layer of the reactant (defined as the diffusion coefficient/flow rate), thereby greatly improving the cleaning speed.

In a specific embodiment of the present invention, the gas flow rate of the middle horizontal hole may be increased or decreased according to the nature of the cleaning liquid. When the atomization rate of the cleaning liquid through the atomizer is low, the gas flow rate of the middle horizontal hole may be increased to promote the full atomization of the cleaning liquid. When the cleaning liquid is substantially atomized by the atomizer, the gas flow of the middle horizontal hole can be reduced or the middle horizontal hole can be closed. The middle horizontal hole may blow the airflow to the wafer surface in pulse mode, accelerate forcibly the wetting of etching residue and photoresist residue which are removed quickly.

At step 750, the cleaning fluid valve is closed and the preheated pure water valve is opened. At this time, the inert gas flow is kept constant or slightly increased. The gas-water two-fluid is also atomized, and the through vias and the surface of the wafer is rinsed and cleaned up.

Figure 8:
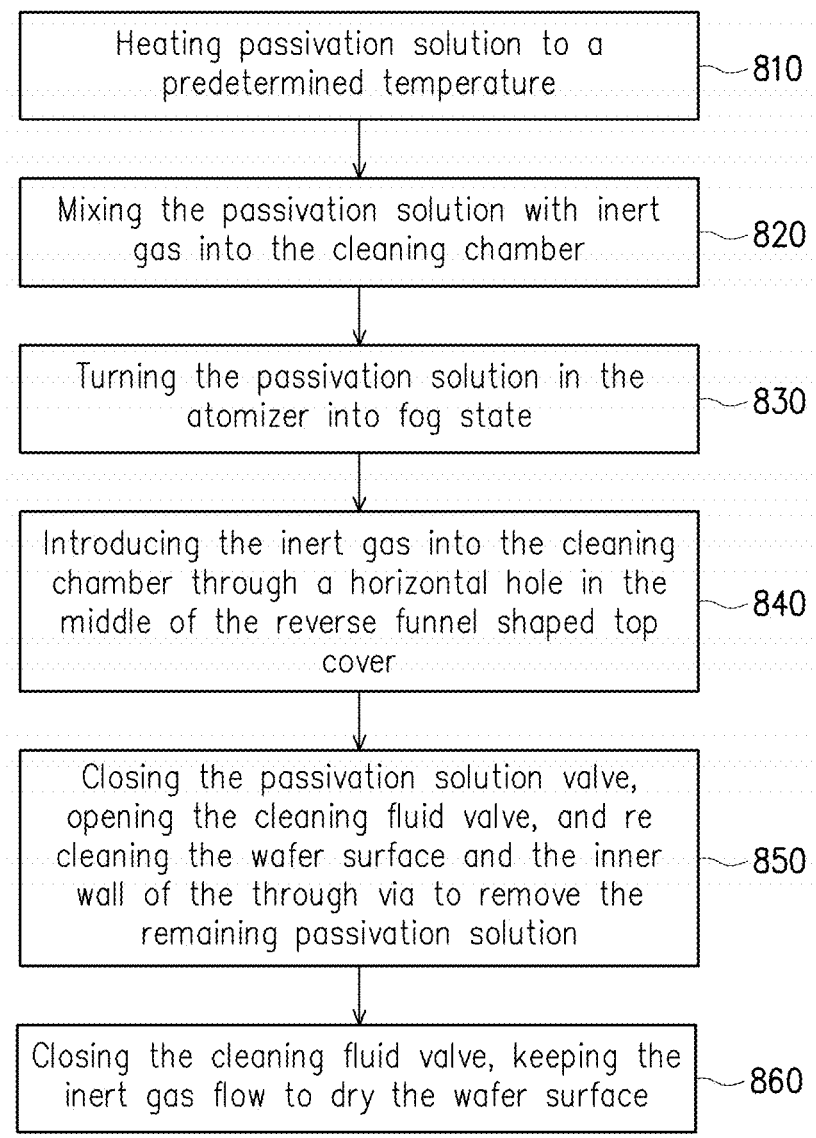
FIG. 8 shows a process flow diagram for passivation using a semiconductor cleaning device according to an embodiment of the present invention.

In the embodiment of the present invention, the semiconductor cleaning device may also be used to perform other wet processes. FIG. 8 shows a process flow diagram for passivation using a semiconductor cleaning device according to an embodiment of the present invention.

At step 810, the passivation solution is heated to a predetermined temperature. For example, the passivation solution may be hydrogen peroxide and water with a ratio of $H_2O_2/H_2O=1:5\sim1:10$, or may have other passivation solution components.

At step 820, the passivation solution may be mixed with inert gas and enter into a cleaning chamber. According to the preset gas-liquid ratio, the flow or pressure of the passivation solution and/or inert gas to be sent may be adjusted, and then the passivation solution and the inert gas are sent into the cleaning cavity together through the three-way valve. In the semiconductor cleaning equipment disclosed in the present invention, the flow velocity of the two-fluid may be changed by adjusting the flow rate of the inert gas (such as nitrogen), meanwhile the behavior of the two-fluid in the atomization device (i.e., atomizer), such as the degree of atomization (i.e. the ratio of the fog and the liquid) and droplet size, may be affected.

In an embodiment of the present invention, the passivation solution may be added in pulse mode by opening and closing the valves of the gas and liquid pipelines. This manner may be used to increase the passivation efficiency of narrow gaps on the wafer surface.

At step 830, the passivation solution is turned into a fog state in the atomizer. The liquid-gas flow enters into the cleaning chamber through the straight through holes and the oblique through holes of the atomizer, and most of the passivation solution turns into a fog state after multiple impacts with the inner wall of the chamber. The passivation solution with the gas enters the inside of the funnel from the atomizer at a high speed. After the gas-liquid two-fluid impacts on the inner surface for the first time, most of the liquid is atomized, and the remaining liquid droplets impact on the inner surface quickly for the second time, and turn into fog state in part.

The heated fog passivation solution is then evenly sprayed on the surface of the wafer, and fully wets the inner wall and bottom of the through via, and the passivation effect is greatly improved.

At step 840, optionally, the inert gas may be introduced into the cleaning chamber through a horizontal hole in the middle of the reverse funnel-shaped top cover. The inert gas may be nitrogen. On the one hand, the incoming inert gas stream turns most of the incoming passivation solution into a fog state, and on the other hand, the laterally flowing inert gas makes the fog on the wafer surface flow in a circle.

In a specific embodiment of the present invention, the gas flow rate of the middle horizontal hole may be increased or decreased according to the nature of the passivation solution. When the atomization rate of the passivation solution through the atomizer is low, the gas flow rate of the middle horizontal hole may be increased to promote the full atomization of the passivation solution. When the passivation solution is substantially atomized by the atomizer, the gas flow of the middle horizontal hole can be reduced or the middle horizontal hole can be closed. The middle horizontal hole may blow the airflow to the wafer surface in pulse mode, accelerate forcibly the spread of the fog.

The heated fog passivation solution is then evenly sprayed on the surface of the wafer, fully wets the surface of the wafer, the inner wall and bottom of the through via. After a certain period of time, a dense silicon oxide layer with a certain thickness is formed on the inner wall of the through silicon via.

At step 850, the passivation solution valve is closed and the cleaning fluid valve is opened, and the wafer surface and the inner wall of the through via is re-cleaned to remove the remaining passivation solution. For example, the cleaning liquid may be pure water.

At step 860, the cleaning fluid valve is closed, and the inert gas flow is kept to dry the wafer surface, and the passivation process completed.

In the cleaning and passivation process disclosed in the present invention, the cleaning liquid and the passivation solution are introduced into the cleaning chamber in the form of two-fluid; then most of the liquid is atomized, and the fog is easier to wet the wafer surface. The water fog is more likely to wet the etching residue and photoresist residue on the wafer surface and the inside of the through silicon via, to peel off from the substrate; especially for the through hole structure with very small diameter, the water droplets of ordinary cleaning manners are difficult to infiltrate into the through hole due to capillary action, therefore the cleaning effect is not good; the water fog can infiltrate the inner wall and bottom of the through hole, and the cleaning effect is greatly improved.

The middle horizontal hole of the reverse funnel-shaped top cover may blow the airflow to the wafer surface in pulse mode, accelerate forcibly the wetting of etching residue and photoresist residue which are removed quickly.

The semiconductor cleaning device of the invention does not need to rotate the wafer and avoids complicated rotating parts and devices.

The reverse funnel type upper chamber design makes the whole cleaning chamber very small.

The atomization cleaning method allows fully use of the cleaning liquid and passivation solution so the consumption is very small. It can not only save cleaning fluid, but also save the cost of wastewater treatment.

By setting valves on the gas and liquid pipelines, it is easy to cut off the supply of cleaning/passivation liquid, and only gas flows into the wafer surface.

The surface of the wafer can be blow-dried, so that the device can realize that it is dry when getting in or out of the device.

After the passivation treatment, a dense $SiO_2$ film layer is formed inside the through silicon via, which is more favorable to the subsequent through silicon via manufacturing process and the bonding force of the silicon matrix, the oxide layer and the seed layer in the through silicon via, and is beneficial to improve reliability of the interposer having through silicon via.

Figure 9:
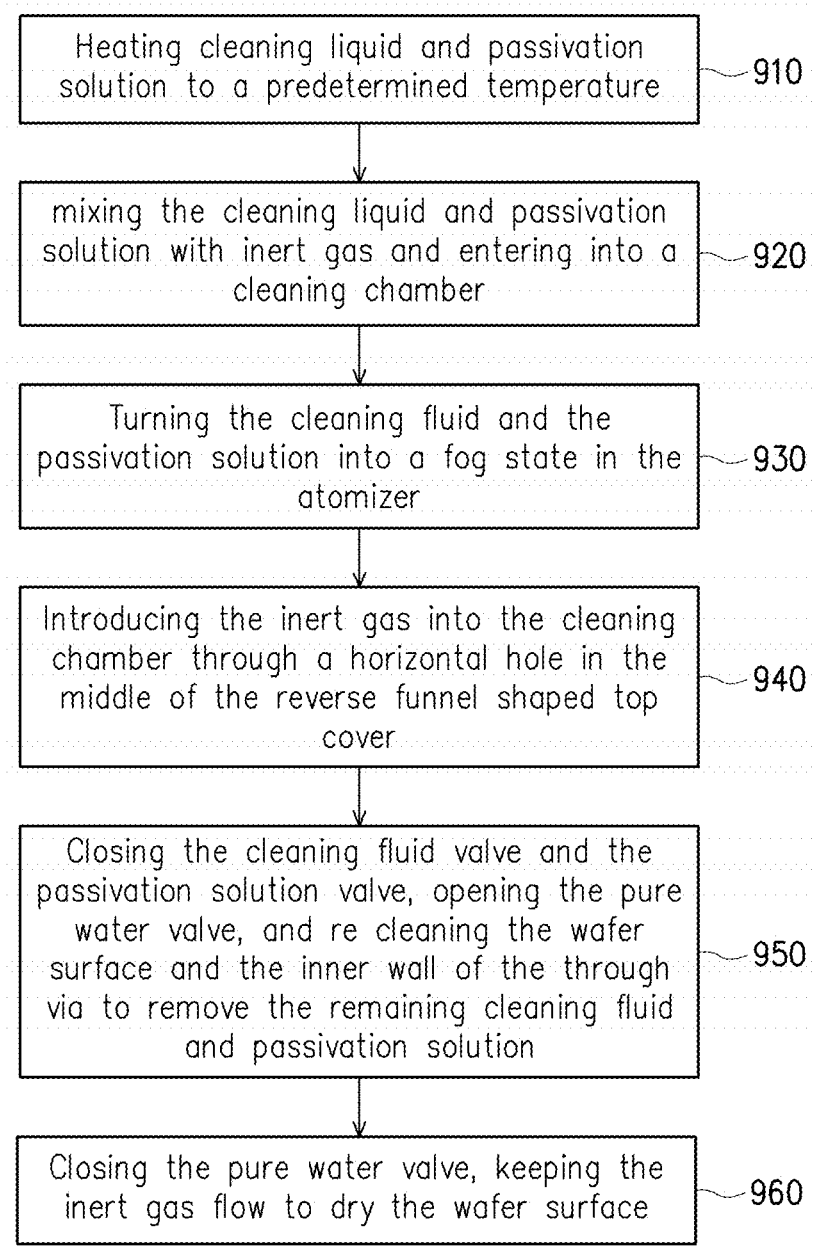
FIG. 9 shows a process flow diagram of through vias cleaning and passivation using a semiconductor cleaning device according to an embodiment of the present invention.

FIG. 9 shows a process flow diagram of through vias cleaning and passivation using a semiconductor cleaning device according to an embodiment of the present invention.

At step 910, the cleaning fluid and the passivation solution is heated to a predetermined temperature. Different types of cleaning fluids may be selected. For example, the cleaning fluid and the passivation solution may be ammonia+hydrogen peroxide+water with the ratio of 1:1:5-1:2:10.

At step 920, the cleaning fluid and the passivation solution may be mixed with inert gas and enter into a cleaning chamber. According to the preset gas-liquid ratio, the flow or pressure of the cleaning fluid and the passivation solution and/or inert gas to be sent may be adjusted, and then the cleaning fluid, the passivation solution and the inert gas are sent into the cleaning cavity together through the three-way valve. In the semiconductor cleaning equipment disclosed in the present invention, the flow velocity of the two-fluid may be changed by adjusting the flow rate of the inert gas (such as nitrogen), meanwhile the behavior of the two-fluid in the atomization device (i.e., atomizer), such as the degree of atomization (i.e. the ratio of the fog and the liquid) and droplet size, may be affected.

In an embodiment of the present invention, the fluid material may be added in pulse mode by opening and closing the valves of the gas and liquid pipelines. This manner may be used to increase the cleaning and passivation efficiency of narrow gaps on the wafer surface.

At step 930, the cleaning fluid and the passivation solution is turned into a fog state in the atomizer. The liquid-gas flow enters into the cleaning chamber through the straight through holes and the oblique through holes of the atomizer, and most of the cleaning fluid and the passivation solution turn into a fog state after multiple impacts with the inner wall of the chamber. The cleaning fluid and passivation solution with the gas enter the inside of the funnel from the atomizer at a high speed. After the gas-liquid two-fluid impacts on the inner surface for the first time, most of the liquid is atomized, and the remaining liquid droplets impact on the inner surface quickly for the second time, and turn into fog state in part.

The heated fog cleaning fluid and passivation solution may be then evenly sprayed on the surface of the wafer, and fully wet the inner wall and bottom of the through hole, and the passivation effect is greatly improved.

When the droplets infiltrate the gaps on the wafer surface, the input port of the two-fluid is closed, so that the surface to be cleaned can be soaked, increasing the surface adsorption time and adsorption capacity of the cleaning agent.

At step 940, optionally, the inert gas may be introduced into the cleaning chamber through a horizontal hole in the middle of the reverse funnel-shaped top cover. The inert gas may be nitrogen. On the one hand, the incoming inert gas stream turns most of the incoming cleaning and passivation solution into a fog state, and on the other hand, the laterally flowing inert gas makes the fog on the wafer surface flow in a circle. The gas flow is increased by introducing gas in the middle of the cavity, and the fog droplets are agitated and diluted again to make the size smaller and close to the gas state.

The fog cleaning fluid and passivation solution may be easier to enter the smaller gaps, and at the same time, may be blown by the continuous inflow of gas to the wafer surface, and the adsorption layer on the surface becomes thin.

The fog droplets are blown by the airflow and rotate rapidly on the wafer surface, which greatly reduces the thickness of the surface adsorption layer of the reactant (defined as the diffusion coefficient/flow velocity), thereby further improving the cleaning speed.

In a specific embodiment of the present invention, the gas flow rate of the middle horizontal hole may be increased or decreased according to the nature of the liquid entering the chamber. When the atomization rate of the liquid through the atomizer is low, the gas flow rate of the middle horizontal hole may be increased to promote the full atomization of the liquid. When the liquid is substantially atomized by the atomizer, the gas flow of the middle horizontal hole can be reduced or the middle horizontal hole can be closed. The middle horizontal hole may blow the airflow to the wafer surface in pulse mode, accelerate forcibly the wetting of etching residue and photoresist residue which are removed quickly. At the same time, the passivation droplet reacts on the surface of through silicon via to form silicon oxide film.

At step 950, the cleaning fluid valve and the passivation solution valve are closed and the preheated pure water valve is opened. At this time, the inert gas flow is kept constant or slightly increased. The gas-water two-fluid is also atomized, and the through vias and the surface of the wafer is rinsed and cleaned up.

At step 960, the pure water valve is closed, and $N_2$ gas still flows into the cavity. The wafer is taken out of the cavity after dried.

Although the various embodiments of the present invention have been described above, it should be understood that they are presented only as examples and not as limitations. It is obvious to those skilled in the relevant art that various combinations, modifications and changes can be made to the various embodiments without departing from the spirit and scope of the present invention. Therefore, the breadth and scope of the present invention disclosed herein should not be limited by the exemplary embodiments disclosed above, but should be defined only in accordance with the appended claims and their equivalents.

What is claimed is:

1. A method for cleaning a through via, comprising:
heating a cleaning liquid to a predetermined temperature;
mixing the cleaning liquid with a first inert gas and entering into a cleaning chamber;
atomizing the cleaning liquid in an atomizer, to spray on a wafer surface and to wet an inner wall and a bottom of the through via, wherein:
the atomizer is a hollow cylinder, the top of the atomizer is sealed, one or more first through holes are on the side of the hollow cylinder, and the cleaning liquid enters the cleaning chamber through the first through holes, the first through hole comprises a straight through hole and an oblique through hole extending horizontally, the straight through hole is substantially vertical to the tangent line at the intersection of the straight through hole and the inner wall of the cylinder; and
the oblique through hole forms a specific angle, but not a right angle, with the tangent line at the intersection of the oblique through hole and the inner wall of the cylinder, and when the fluid is connected to the first through hole, the fluid passes through the straight through hole to the center of the hollow cylinder, and the fluid enters the hollow cylinder through the oblique through hole in a direction inclined to the direction of the straight through hole, the cleaning liquid turns into a fog state after multiple impacts with the inner wall of the cleaning chamber; and
closing a cleaning liquid valve.

2. The method of claim 1, wherein a flow velocity of a two-fluid composed of the cleaning liquid and the first inert gas is changed by adjusting a flow rate of the first inert gas, and an atomization degree and a droplet size of the two-fluid in the atomizer are changed at the same time.

3. The method of claim 1, wherein the cleaning fluid is added in a pulse mode by opening and closing the valves of the gas and liquid pipelines.

4. The method of claim 1, further comprising: introducing the first inert gas into the cleaning chamber through a horizontal hole in a middle of a reverse funnel-shaped top cover.

5. The method of claim 1, after closing the cleaning liquid valve, further comprising:
opening a preheated pure water valve;
keeping the flow rate of the first inert gas constant or slightly increasing the flow rate of the first inert gas; and
atomizing a gas-water two-fluid, and using an atomized water to rinse an inside of the through via and the wafer surface.

6. The method of claim 1, further comprising, after cleaning,
heating a passivation solution to a predetermined temperature;
mixing the passivation solution with a second inert gas into the cleaning chamber;
turning the passivation solution in the atomizer into an atomized state, to spray on the wafer surface and to wet the inner wall and the bottom of the through via, and to forma silicon oxide layer having a thickness on the inner wall of through silicon via; and
closing a passivation solution valve.

7. The method of claim 6, after closing the passivation solution valve, further comprising:
opening a pure water valve and re-cleaning the wafer surface and the inner wall of the through via to remove the remaining passivation liquid;
closing the pure water valve and keeping the second inert gas flow to dry the wafer surface.

8. A method for cleaning and passivating a through via, comprising:
heating a cleaning liquid and a passivation solution to a predetermined temperature;
mixing the cleaning liquid and the passivation solution with an inert gas and entering into a cleaning chamber;
atomizing the cleaning liquid and the passivation solution in an atomizer, to spray on an wafer surface and wet an inner wall and a bottom of the through via, wherein:
the atomizer is a hollow cylinder, the top of the atomizer is sealed, one or more first through holes are on the side of the hollow cylinder, and the cleaning liquid enter the cleaning chamber through the first through holes, the first through hole comprises a straight through hole and an oblique through hole extending horizontally, the straight through hole is substantially vertical to the tangent line at the intersection of the straight through hole and the inner wall of the cylinder; and
the oblique through hole forms a specific angle, but not a right angle, with the tangent line at the intersection of the oblique through hole and the inner wall of the cylinder, and when the fluids are connected to the first through hole, they pass through the straight through hole to the center of the hollow cylinder, and enter the hollow cylinder through the oblique through hole in a direction inclined to the direction of the straight through hole, the fluids turn into a fog state after multiple impacts with the inner wall of the cleaning chamber; and closing a cleaning liquid valve and a passivation solution valve.

9. The method of claim 8, wherein a flow velocity of a two-fluid composed of the liquid and the gas is changed by adjusting a flow rate of the inert gas, and an atomization degree and a droplet size of the two-fluid in the atomizer are changed at the same time.

10. The method of claim 8, wherein the cleaning liquid and the passivation solution are added in a pulse mode by opening and closing the valves of the gas and liquid pipelines.

11. The method of claim 8, further comprising: introducing the inert gas into the cleaning chamber through a horizontal hole in a middle of a reverse funnel-shaped top cover.

12. The method of claim 8, after closing the cleaning liquid valve and the passivation solution valve, further comprising:

opening a pure water valve and re-cleaning the wafer surface and the inner wall of the through via to remove the remaining cleaning liquid and passivation liquid; and closing the pure water valve and keeping the inert gas flow to dry the wafer surface.

\* \* \* \* \*